(12) United States Patent
Shyu

(10) Patent No.: US 7,994,873 B2
(45) Date of Patent: Aug. 9, 2011

(54) BALUN DEVICE

(75) Inventor: Ying-Chieh Shyu, Pusin Township, Changhua County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 169 days.

(21) Appl. No.: 12/427,294

(22) Filed: Apr. 21, 2009

(65) Prior Publication Data

US 2010/0060376 A1    Mar. 11, 2010

Related U.S. Application Data

(60) Provisional application No. 61/136,504, filed on Sep. 10, 2008.

(30) Foreign Application Priority Data

Feb. 10, 2009   (TW) ................................ 98104245 A

(51) Int. Cl.
*H03H 7/42* (2006.01)
*H01P 3/08* (2006.01)

(52) U.S. Cl. .......................................... 333/25; 333/236

(58) Field of Classification Search .................... 333/25, 333/26, 236
See application file for complete search history.

(56) References Cited

U.S. PATENT DOCUMENTS

| | | | |
|---|---|---|---|
| 5,793,265 A * | 8/1998 | Spielman | 333/132 |
| 6,097,273 A | 8/2000 | Frye et al. | |
| 6,577,219 B2 | 6/2003 | Visser | |
| 6,798,326 B2 | 9/2004 | Iida | |
| 6,927,664 B2 | 8/2005 | Nakatani et al. | |
| 7,129,803 B2 * | 10/2006 | Khorram et al. | 333/25 |
| 7,629,860 B2 | 12/2009 | Liu et al. | |
| 2009/0039999 A1 | 2/2009 | Fujii et al. | |
| 2009/0146770 A1 | 6/2009 | Lee et al. | |

* cited by examiner

*Primary Examiner* — Dean O Takaoka
(74) *Attorney, Agent, or Firm* — Muncy, Geissler, Olds & Lowe, PLLC

(57) ABSTRACT

A balun device including a first to a third inductance elements and a first to a third capacitance elements is provided. The first inductance element has a first end for receiving an input signal and a second end. The second inductance element has a third end and a fourth end, wherein the third and the forth ends are for outputting a first and a second output signals corresponding to the input signal, respectively. The first output signal and the second output signal substantially have the same amplitude and opposite phases. The first and the second inductance elements generate mutual inductance. The first capacitance element is coupled to the first end. The second capacitance element is coupled to the third end. The third capacitance element is coupled to the fourth end. The third inductance element is seriesly connected to one of the first to the third capacitance elements.

8 Claims, 7 Drawing Sheets

BALUN DEVICE

This application claims the benefit of U.S. provisional application Ser. No. 61/136,504, filed Sep. 10, 2008, and Taiwan application Serial No. 98104245, filed Feb. 10, 2009, the subject matter of which is incorporated herein by reference.

BACKGROUND OF THE INVENTION

1. Field of the Invention

The invention relates in general to a balun device, and more particularly to a balun device with wave-filtering function.

2. Description of the Related Art

Along with the booming growth in the industry of wireless communication, more and more communication products are developed and provided, and how to improve the function of a communication product has become one of imminent goals to be achieved. In a communication product, the radio frequency module of a communication device includes an antenna, a low noise amplifier, a filter, a balun device, and so on.

After a wireless signal is received by the antenna of the communication device, a single port electrical signal outputted from the antenna will be outputted to the balun device. Then, the balun device converts the single port electrical signal into a dual port electrical signal, and further outputs the dual port electrical signal to a next-stage circuit for further processing. If the wave-filtering effect of the filter is not good enough, the balun device needs to be equipped with wave-filtering function. Thus, how to provide a balun device with wave-filtering function has become one of the imminent goals to the manufacturers.

SUMMARY OF THE INVENTION

The invention is directed to a balun device, wherein the decay rate at the stopband of the balun device can be increased, so that the balun device produces excellent wave-filtering effect.

According to a first aspect of the present invention, a balun device is provided. The balun device includes a first inductance element, a second inductance element, a first capacitance element, a second capacitance element, a third capacitance element and a third inductance element. The first inductance element has a first end and a second end, wherein the first end is for receiving an input signal. The second inductance element has a third end and a fourth end, wherein the third end is for outputting a first output signal corresponding to the input signal, and the fourth end is for outputting a second output signal corresponding to the input signal. The first output signal and the second output signal substantially have the same amplitude but have opposite phases. The second inductance element and the first inductance element generate mutual inductance. The first capacitance element is coupled to the first end. The second capacitance element is coupled to the third end. The third capacitance element is coupled to the fourth end. The third inductance element is connected to one of the first capacitance element in series, the second capacitance element and the third capacitance element.

The invention will become apparent from the following detailed description of the preferred but non-limiting embodiments. The following description is made with reference to the accompanying drawings.

DETAILED DESCRIPTION OF THE INVENTION

The invention discloses a balun device including a first inductance element, a second inductance element, a first capacitance element, a second capacitance element, a third capacitance element and a third inductance element. The first inductance element has a first end and a second end, wherein the first end is for receiving an input signal. The second inductance element has a third end and a fourth end, wherein the third end is for outputting a first output signal corresponding to the input signal, and the fourth end is for outputting a second output signal corresponding to the input signal. The first output signal and the second output signal substantially have the same amplitude but have opposite phases. The second inductance element and the first inductance element generate mutual inductance. The first capacitance element is coupled to the first end. The second capacitance element is coupled to the third end. The third capacitance element is coupled to the fourth end. The third inductance element is connected to one of the first capacitance element in series, the second capacitance element and the third capacitance element. A number of embodiments are disclosed below for elaborating the invention.

Figure 1:
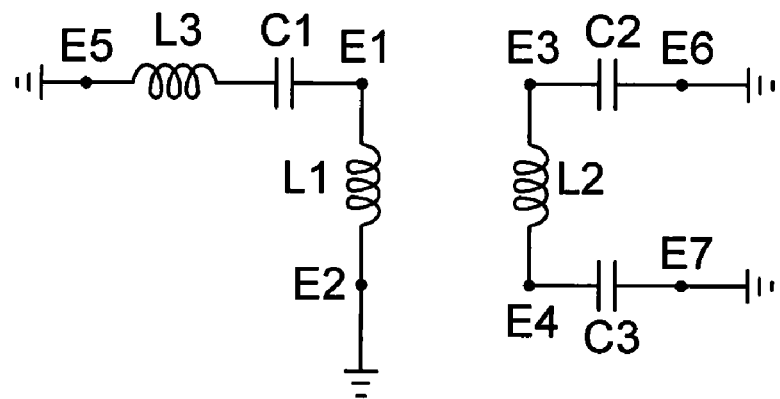
FIG. 1 shows a circuit diagram of a balun device according to an embodiment of the invention.

Referring to FIG. 1, a circuit diagram of a balun device according to an embodiment of the invention is shown. The balun device 100 includes a first inductance element L1, a second inductance element L2, a first capacitance element C1, a second capacitance element C2, a third capacitance element C3 and a third inductance element L3. The first inductance element L1 has a first end E1 and a second end E2, wherein the first end E1 is for receiving an input signal. The second inductance element L2 has a third end E3 and a fourth end E4, wherein the third end E3 is for outputting a first output signal corresponding to the input signal, and the fourth end E4 is for outputting a second output signal corresponding to the input signal. The first output signal and the second output signal substantially have the same amplitude but have opposite phases. The second inductance element L2 and the first inductance element L1 generate mutual inductance. The first output signal and the second output signal may be a pair of differential signals.

As indicated in FIG. 1, the first capacitance element C1 is coupled to the first end E1, the second capacitance element C2 is coupled to the third end E3, and the third capacitance element C3 is coupled to the fourth end E4. The third inductance element L3 is connected to the first capacitance element C1 in series, and one end E5 of the third inductance element L3 is grounded. One end E6 of the second capacitance element C2 and one end E7 of the third capacitance element C3 are grounded. Despite the third inductance element L3 of the present embodiment is connected to the first capacitance element C1, the invention is not limited thereto. The third inductance element L3 can also be connected to the second capacitance element C2 or the third capacitance element C3 in series. When the third inductance element L3 is connected to the second capacitance element C2 in series, the end of the third inductance element L3 which is not connected to the second capacitance element C2 will be grounded. When the third inductance element L3 is connected to the third capacitance element C3 in series, the end of the third inductance element L3 which is not connected to the second capacitance element C2 will be grounded.

Figure 2:
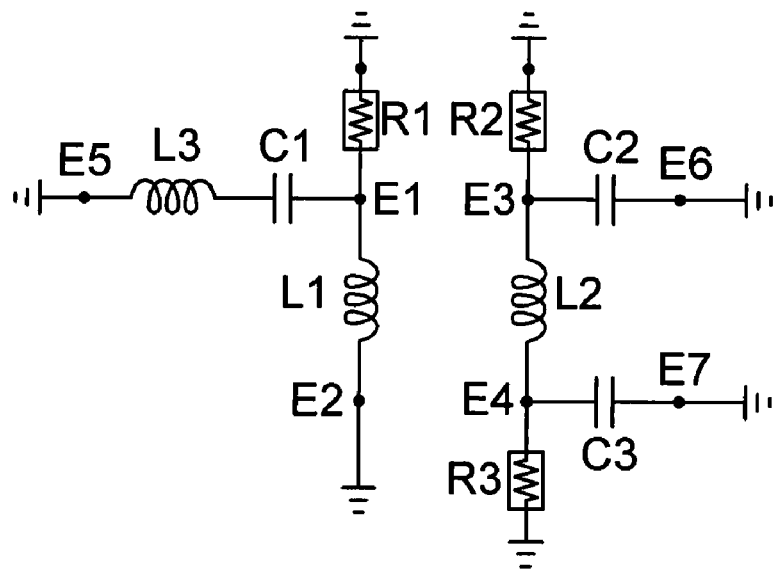
FIG. 2 shows a simulated circuit diagram of the balun device in FIG. 1 being in differential mode.

Referring to both FIG. 1 and FIG. 2. FIG. 2 shows a simulated circuit diagram of the balun device in FIG. 1 being in differential mode. During the simulation, it is assumed that the balun device 100 is electrically connected with the input end impedance R1, the load end impedance R2, and the load end impedance R3 for performing simulation. One end of the input end impedance R1 is coupled to the first end E1, and the other end of the input end impedance R1 is grounded. One end of the load end impedance R2 is coupled to the third end E3, and the other end of the load end impedance R2 is grounded. One end of the load end impedance R3 is coupled to the fourth end E4, and the other end of the load end impedance R3 is grounded.

The following parameters are applied to the elements of FIG. 2 for simulation: L1=L2=3 nH, L3=0.45 nH, C1=1.5 pF, C2=2.3 pF, C3=2.7 pF, R1=R2=R3=50Ω.

Figure 3:
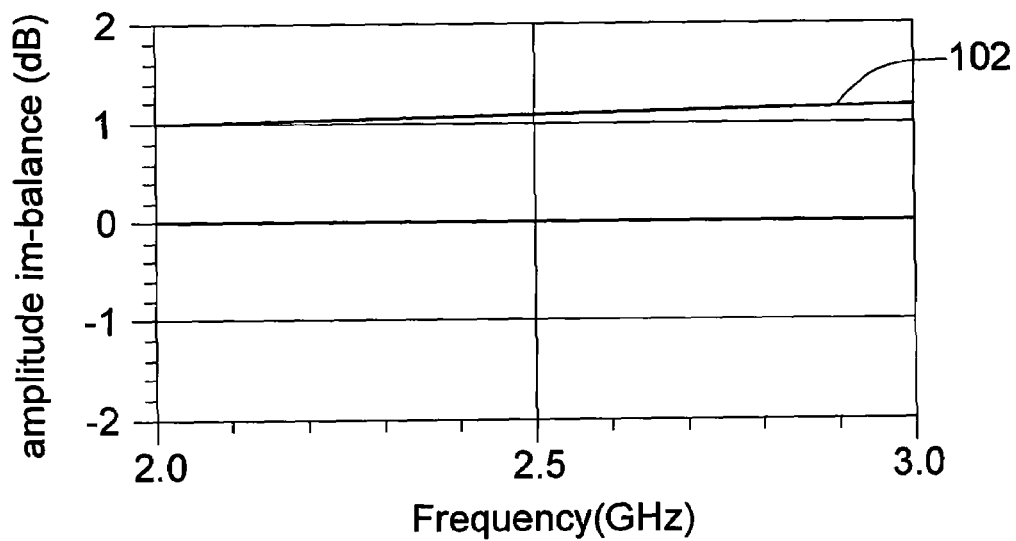
FIG. 3 shows a simulation result of the amplitude imbalance between a first output signal and a second output signal in FIG. 2.

Referring to FIG. 3, a simulation result of the amplitude im-balance between a first output signal and a second output signal in FIG. 2 is shown. As indicated in FIG. 3, within the frequency band of 2 GHz~3 GHz, the curve 102 of the amplitude balance of the balun device 100 shows that the amplitude im-balance between the first output signal and the second output signal is about 1 dB to 1.2 dB and is within the tolerance range.

Figure 4:
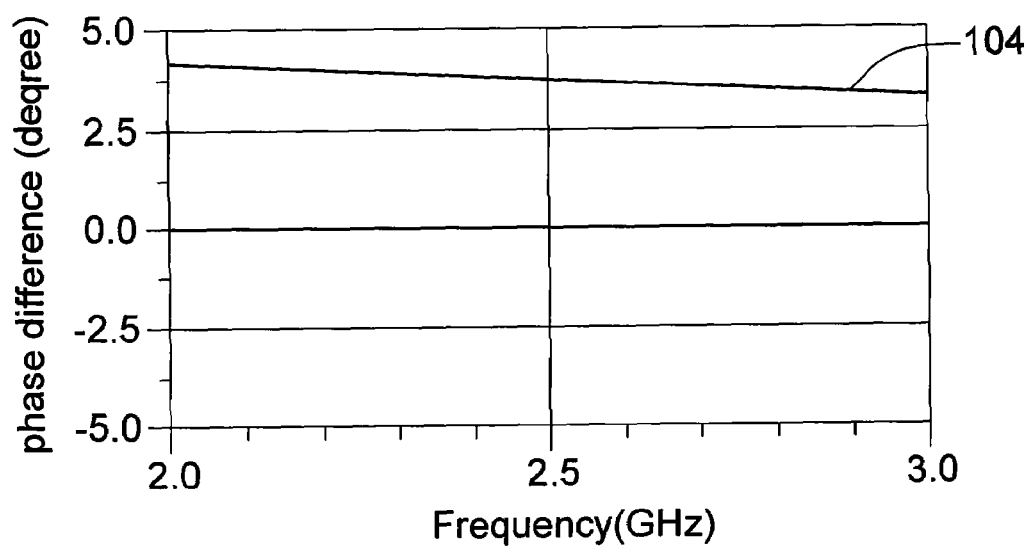
FIG. 4 shows a simulation result of a phase difference between the first output signal and the second output signal in FIG. 2.

Referring to FIG. 4, a simulation result of a phase difference between the first output signal and the second output signal in FIG. 2 is shown. As indicated in FIG. 4, within the frequency band of 2 GHz~3 GHz, the curve 104 of the amplitude balance of the balun device 100 shows that the phase difference between the first output signal and the second output signal is about 3 degrees to 4.5 degrees and is within the tolerance range.

Figure 5:
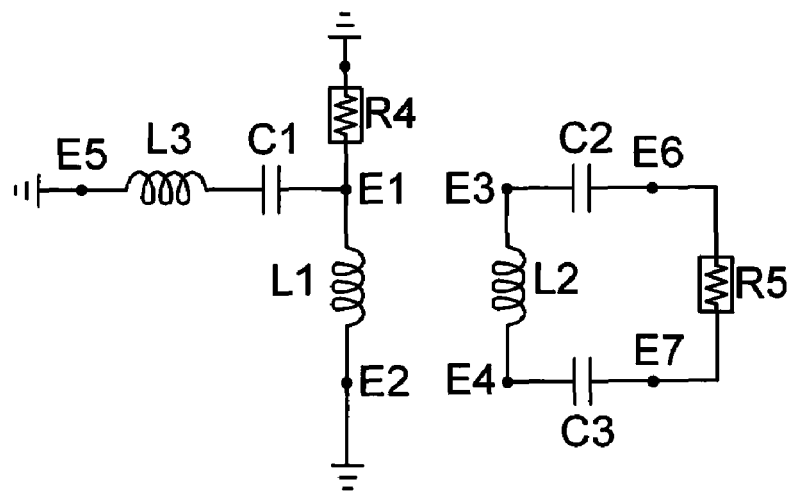
FIG. 5 shows a simulated circuit diagram of the balun device in FIG. 1 being in common mode.

Referring to FIG. 5, a simulated circuit diagram of the balun device in FIG. 1 being in common mode is shown. During the simulation, it is assumed that the balun device 100 is electrically connected with the input end impedance R4 and the load end impedance R5 for performing simulation. One end of the input end impedance R4 is coupled to the first end E1, and the other end of the input end impedance R4 is grounded. One end E6 of the second capacitance element C2 and one end E7 of the third capacitance element C3 are respectively coupled to the two ends of the load end impedance R5.

Figure 6:
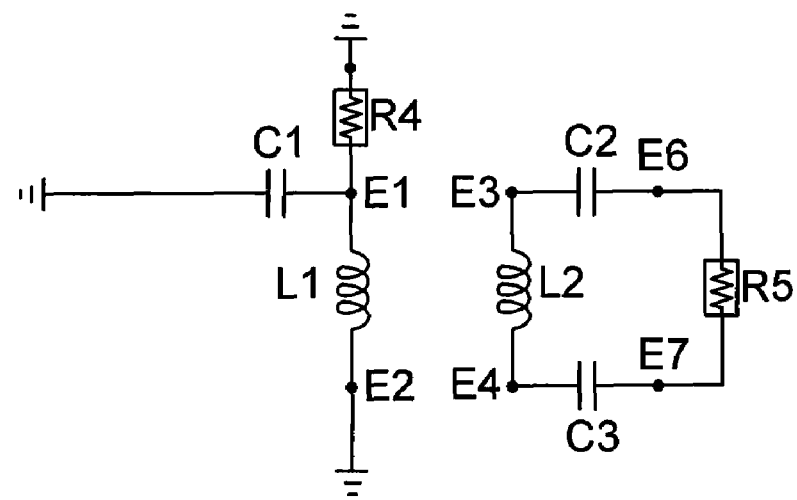
FIG. 6 shows a simulated circuit diagram of the balun device in FIG. 1 being in common mode with the third inductance element L3 being removed.

Referring to FIG. 6, a simulated circuit diagram of the balun device in FIG. 1 being in common mode with the third inductance element L3 being removed is shown.

Figure 7:
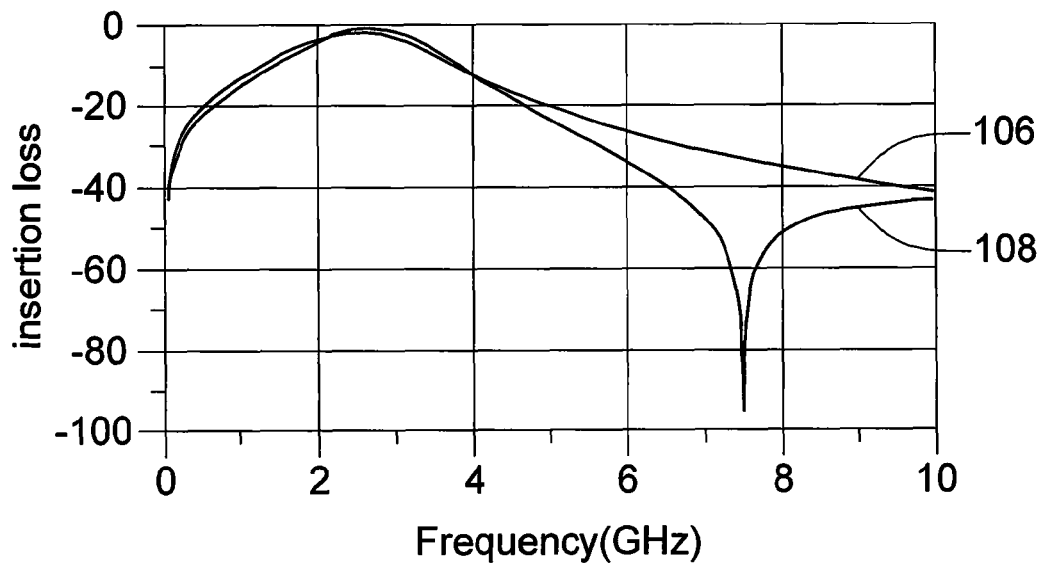
FIG. 7 shows a simulation result of the insertion loss according to the simulated circuit of the balun device in FIG. 5 and FIG. 6.

Referring to FIG. 7, which shows a simulation result of the insertion loss according to the simulated circuit of the balun device in FIG. 5 and FIG. 6. The curve 108 corresponds to FIG. 5, and the curve 106 corresponds to FIG. 6. The curve 108 of the insertion loss of the balun device 100 has a transmission zero around the frequency of 7.5 GHz, so that the decay rate at the stopband near the transmission zero is larger than the decay rate at the stopband on the curve 106. Thus, the balun device 100 of the present embodiment indeed has wave-filtering function and its wave-filtering effect can compensate other filters for their deficiencies. Also, by adjusting the inductance value of the third inductance element L3 of the balun device 100, the frequency of the transmission zero can thus be adjusted.

However, the balun device of the present embodiment is not limited to use one inductance element being connected with one capacitance element in series, and several inductance elements can also be used to be connected with several capacitors in series respectively.

Figure 8:
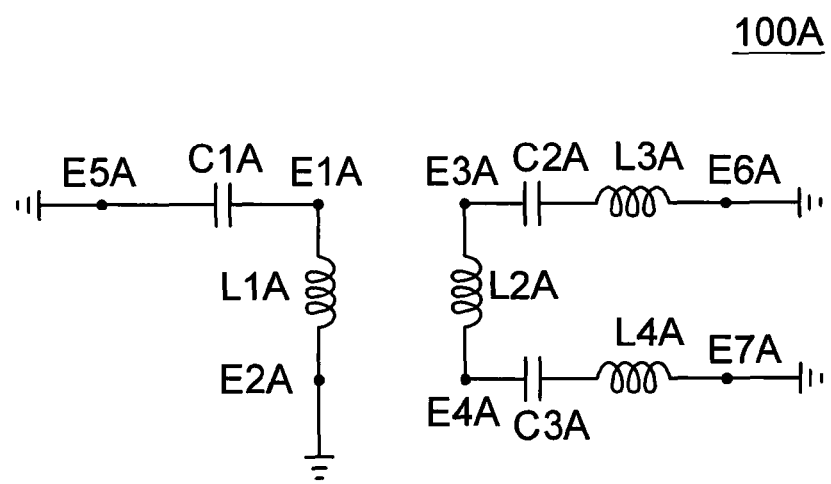
FIG. 8 shows a circuit diagram of a balun device according to another embodiment of the invention.

Referring to FIG. 8, a circuit diagram of a balun device according to another embodiment of the invention is shown. The balun device 100A includes a first inductance element L1A, a second inductance element L2A, a first capacitance element C1A, a second capacitance element C2A, a third capacitance element C3A, a third inductance element L3A and a fourth inductance element L4A. The first inductance element WA has a first end E1A and a second end E2A, wherein the first end E1A is for receiving an input signal, and the second end E2A is grounded. The second inductance element L2A has a third end E3A and a fourth end E4A, wherein the first capacitance element C1A is coupled to the first end E1A, and one end E5A of the first capacitance element C1A is grounded. The second capacitance element C2A is coupled to the third end E3A, and the third capacitance element C3A is coupled to the fourth end E4A. The third inductance element L3A is connected to the second capacitance element C2A in series, and one end E6A of the third inductance element L3A is grounded. The fourth inductance element L4A is connected to the third capacitance element C3A in series, and one end E7A of the fourth inductance element L4A is grounded.

Figure 9:
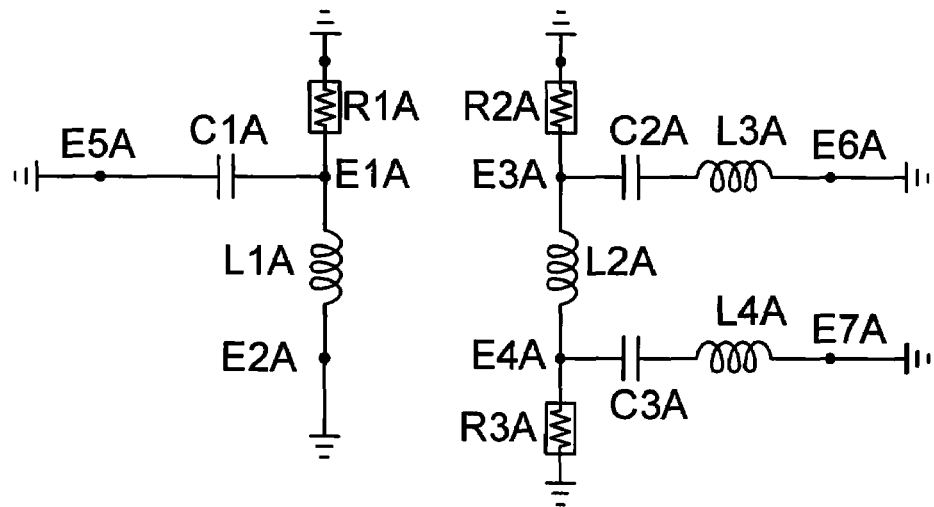
FIG. 9 shows a simulated circuit diagram of the balun device in FIG. 8 being in differential mode.

Referring to both FIG. 8 and FIG. 9. FIG. 9 shows a simulated circuit diagram of the balun device of FIG. 8 being in differential mode. During the simulation, it is assumed that the balun device 100A is electrically connected with the input end impedance R1A, the load end impedance R2A and the load end impedance R3A for performing simulation. One end of the input end impedance R1A is coupled to the first end E1A, and the other end of the input end impedance R1A is grounded. One end of the load end impedance R2A is coupled to the third end E3A, and the other end of the load end impedance R2A is grounded. One end of the load end impedance R3A is coupled to the fourth end E4A, and the other end of the load end impedance R3A is grounded.

The following parameters are applied to the elements in FIG. 9 for simulation: L1A=3 nH, L2A=3 nH, L3A=0.45 nH, L4A=0.175 nH, R1A=R2A=R3A=50Ω, C1A=1.5 pF, C2A=2.3 pF, C3A=2.7 pF.

Figure 10:
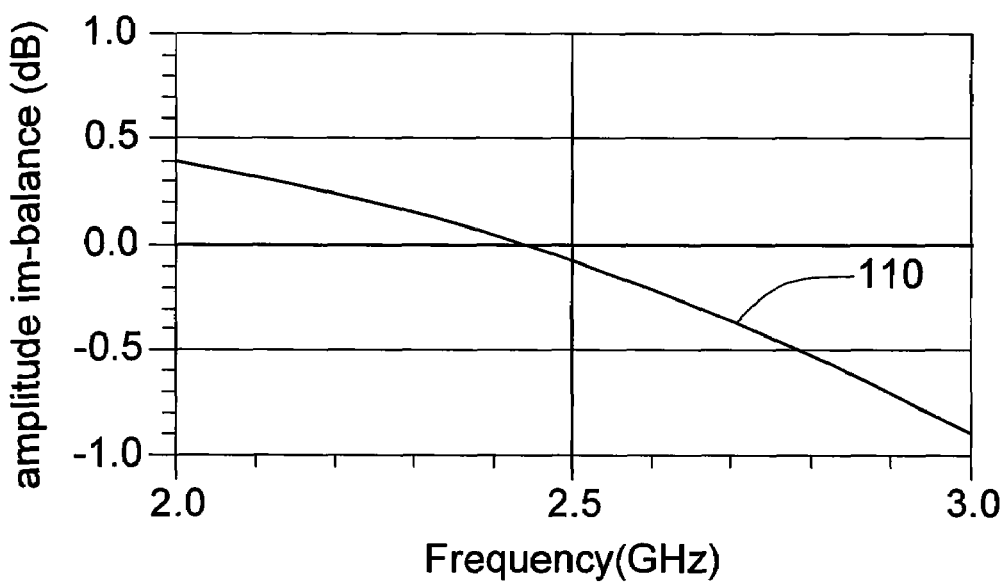
FIG. 10 shows a simulation result of the amplitude imbalance between a first output signal and a second output signal in FIG. 9.

Referring to FIG. 10, a simulation result of the amplitude im-balance between a first output signal and a second output signal in FIG. 9 is shown. Within the frequency band of 2 GHz~3 GHz, the curve 110 of the amplitude balance of the balun device 100A shows that the amplitude im-balance between the first output signal and the second output signal is about 0.4 dB to −0.9 dB and is within the tolerance range.

Figure 11:
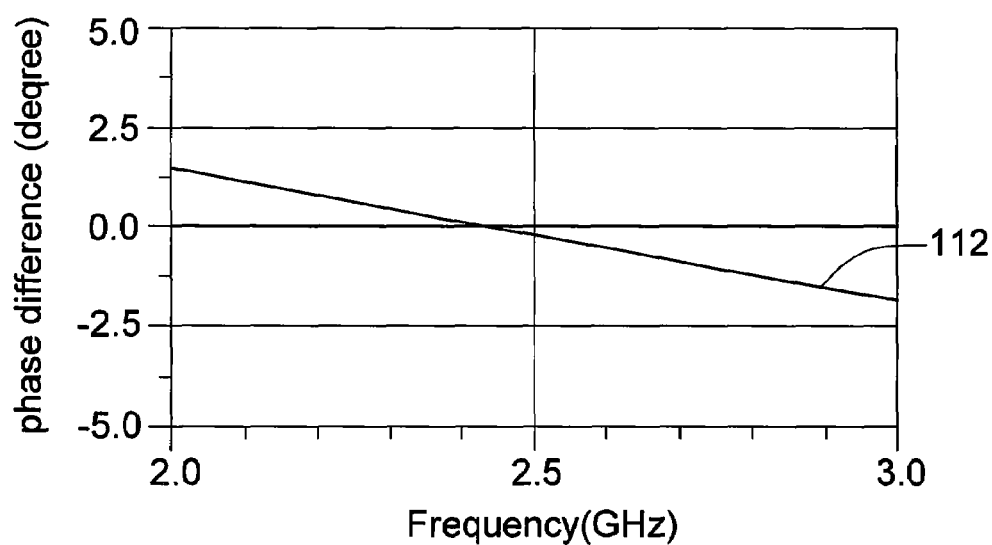
FIG. 11 shows a simulation result of a phase difference between the first output signal and the second output signal in FIG. 9.

Referring to FIG. 11, a simulation result of a phase difference between the first output signal and the second output signal in FIG. 9 is shown. As indicated in FIG. 11, within the frequency band of 2 GH~3 GHz, the curve 112 of the amplitude balance of the balun device 100A shows that the phase difference between the first output signal and the second output signal is about 1.5 degrees to −1.5 degrees and is within the tolerance range.

Figure 12:
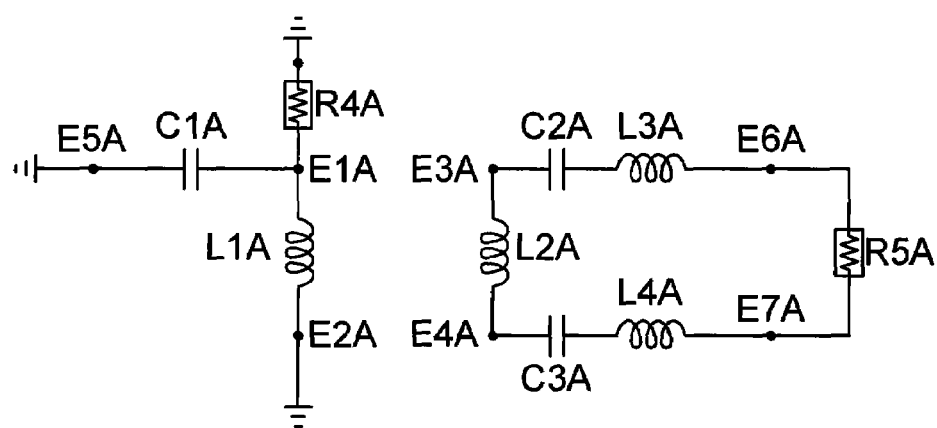
FIG. 12 shows a simulated circuit diagram of the balun device in FIG. 9 being in common mode.

Referring to FIG. 12, a simulated circuit diagram of the balun device in FIG. 9 being in common mode is shown. During the simulation, it is assumed that the balun device 100A is electrically connected with the input end impedance R4A and the load end impedance R5A for performing simulation. One end of the input end impedance R4A is coupled to the first end E1A, and the other end of the input end impedance R4A is grounded. One end E6A of the third inductance element L3A and one end E7A of the fourth inductance element L4A are respectively coupled to the two ends of the load end impedance R5A.

Figure 13:
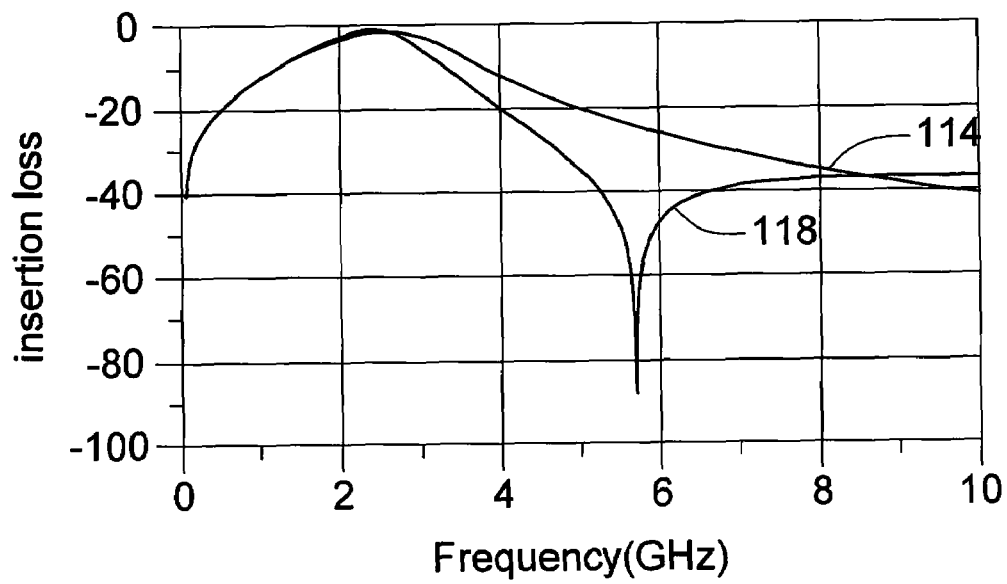
FIG. 13 shows a simulation result of the insertion loss according to the simulated circuit of the balun device in FIG. 6 and FIG. 12.

Referring to FIG. 13, which shows a simulation result of the insertion loss according to the simulated circuit of the balun device in FIG. 6 and FIG. 12. The curve 114 corresponds to FIG. 6, and the curve 118 corresponds to FIG. 12. The curve 118 of the insertion loss of the balun device 100A has a transmission zero at the frequency of 5.7 GHz so that the decay rate at the stopband around the transmission zero is larger than the decay rate at the stopband on the curve 116. Also, by adjusting the inductance value of the third inductance element L3 and the fourth inductance element L4 of the balun device 100A, the frequency of the transmission zero can thus be adjusted.

Figure 14:
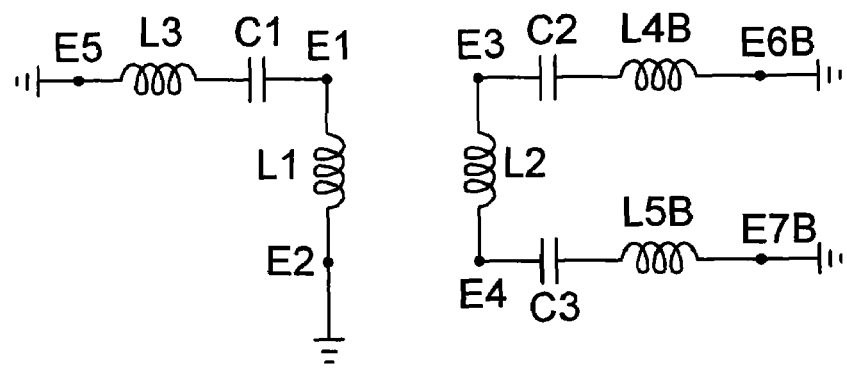
FIG. 14 shows a circuit diagram of a balun device according to further another embodiment of the invention.

Referring to FIG. 14, a circuit diagram of a balun device according to further another embodiment of the invention is shown. FIG. 14 differs with FIG. 1 in that the balun device 100B further includes a fourth inductance element L4B and a fifth inductance element L5B. The fourth inductance element L4B is connected to the second capacitance element C2 in series, and one end E6B of the fourth inductance element L4B is grounded. The fifth inductance element L5B is connected to the third capacitance element C3 in series, and one end E7B of the fifth inductance element L5B is grounded. If the third inductance element L3 and the fourth inductance element L4B of the present embodiment are different, two transmission zeros at different frequencies are generated in a frequency response of the insertion loss for the balun device.

The balun device of the invention has excellent wave-filtering function so as to increase the decay rate at the stopband of the balun device to produce excellent wave-filtering effect for compensating other filters for their deficiencies. Thus, the communication products using the balun device of the invention has even better efficiency in use and its market competitiveness is improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A balun device, comprising:
   a first inductance element having a first end and a second end, wherein the first end is for receiving an input signal; and
   a second inductance element having a third end and a fourth end, wherein the third end is for outputting a first output signal corresponding to the input signal, the fourth end is for outputting a second output signal corresponding to the input signal, the first output signal and the second output signal substantially have the same amplitude but have opposite phases, and the second inductance element and the first inductance element generate mutual inductance;
   a first capacitance element coupled to the first end;
   a second capacitance element coupled to the third end;
   a third capacitance element coupled to the fourth end; and
   a third inductance element having one end connected to one of the first capacitance element, the second capacitance element and the third capacitance element in series, the other end of the third inductance element is grounded.

2. The balun device according to claim 1, further comprising a fourth inductance element, wherein the third inductance element is connected to the second capacitance element in series, and the fourth inductance element is connected to the third capacitance element in series.

3. The balun device according to claim 2, wherein the third inductance element and the fourth inductance element have the same inductance value.

4. The balun device according to claim 2, wherein the third inductance element and the fourth inductance element have different inductance values.

5. The balun device according to claim 1, further comprising a fourth inductance element and a fifth inductance element, wherein the third inductance element is connected to the first capacitance element in series, the fourth inductance element is connected to the second capacitance element in series, and the fifth inductance element is connected to the third capacitance element in series.

6. The balun device according to claim 5, wherein the fourth inductance element and the fifth inductance element have the same inductance value.

7. The balun device according to claim 6, wherein the fourth inductance element and the third inductance element have different inductance values, so that the balun device generates two transmission zeros at different frequencies in the frequency response of the insertion loss.

8. The balun device according to claim 6, wherein the fourth inductance element and the fifth inductance element have different inductance values.

* * * * *